United States Patent [19]

Tipon

[11] 4,254,407
[45] Mar. 3, 1981

[54] DATA PROCESSING SYSTEM HAVING OPTICALLY LINKED SUBSYSTEMS, INCLUDING AN OPTICAL KEYBOARD

[75] Inventor: Donald G. Tipon, San Diego, Calif.

[73] Assignee: NCR Corporation, Dayton, Ohio

[21] Appl. No.: 58,702

[22] Filed: Jul. 18, 1979

[51] Int. Cl.³ .............................. G06F 3/02; A04B 9/00
[52] U.S. Cl. ................................ 340/365 P; 455/612
[58] Field of Search ............ 340/365 R, 365 P, 365 S, 340/190, 201 P, 183, 185; 250/199, 215; 364/200 MS File, 900 MS File; 356/96.16, 96.23; 179/15 AL, 15 AQ, 90 K; 455/612, 613, 617, 618; 370/86, 66, 85; 178/17 C

[56] References Cited

U.S. PATENT DOCUMENTS

| | | | |
|---|---|---|---|
| 3,588,838 | 6/1971 | Felcheck | 364/900 |
| 3,614,402 | 10/1971 | Higgins | 340/365 P |
| 3,856,127 | 12/1974 | Halfon et al. | 340/365 P |
| 4,047,158 | 9/1977 | Jennings | 364/900 |
| 4,089,584 | 5/1978 | Polczynski | 250/199 |

OTHER PUBLICATIONS

*IEEE Transactions on Communications*, Rawson et al., vol. Com-26, No. 7, Jul. 1978, pp. 983-990.

Primary Examiner—James J. Groody
Attorney, Agent, or Firm—J. T. Cavender; Edward Dugas; Stephen F. Jewett

[57] ABSTRACT

A data processing system having optically linked subsystems, including an optical keyboard. The optical keyboard includes sequentially strobed LED's arranged to provide intersecting light paths in an X-Y matrix. A key on the keyboard is associated with each intersection of the light paths. When the key is depressed, the optical signals on the intersecting light paths are blocked. The resulting coded optical signals are used directly in transmitting to another subsystem the data entered at the keyboard.

8 Claims, 6 Drawing Figures

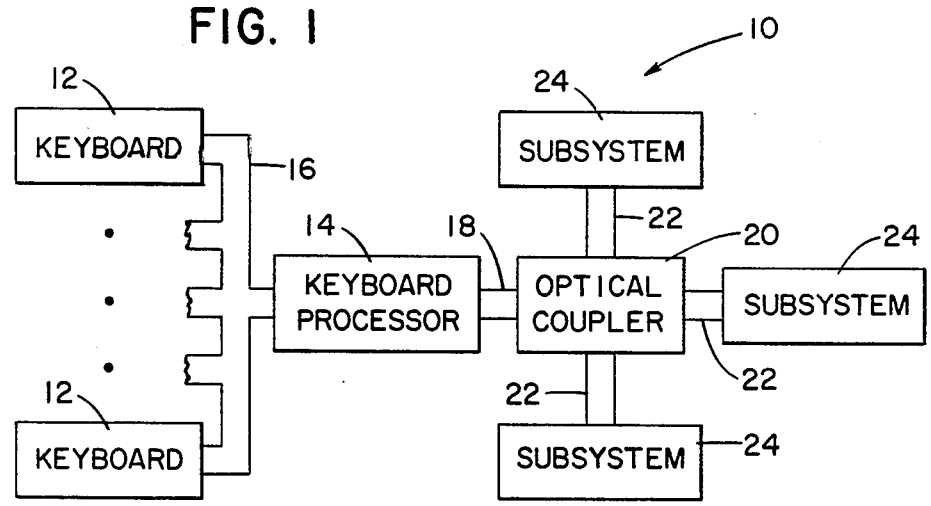
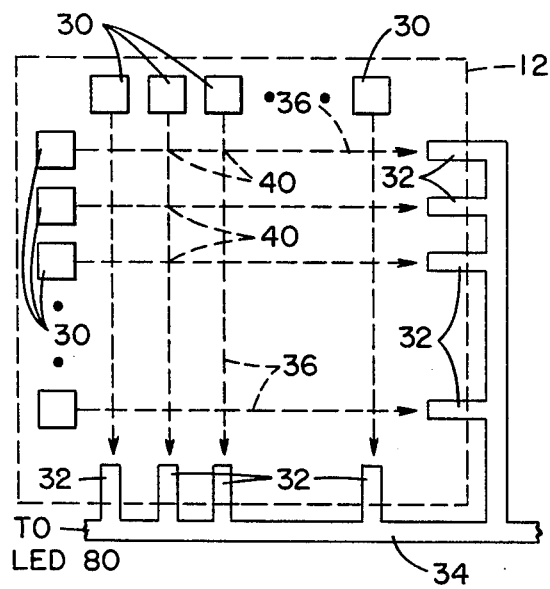
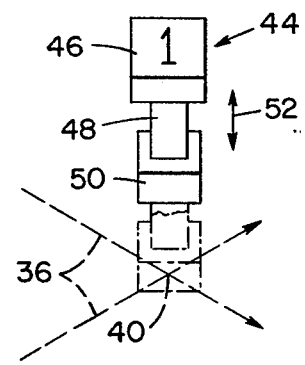

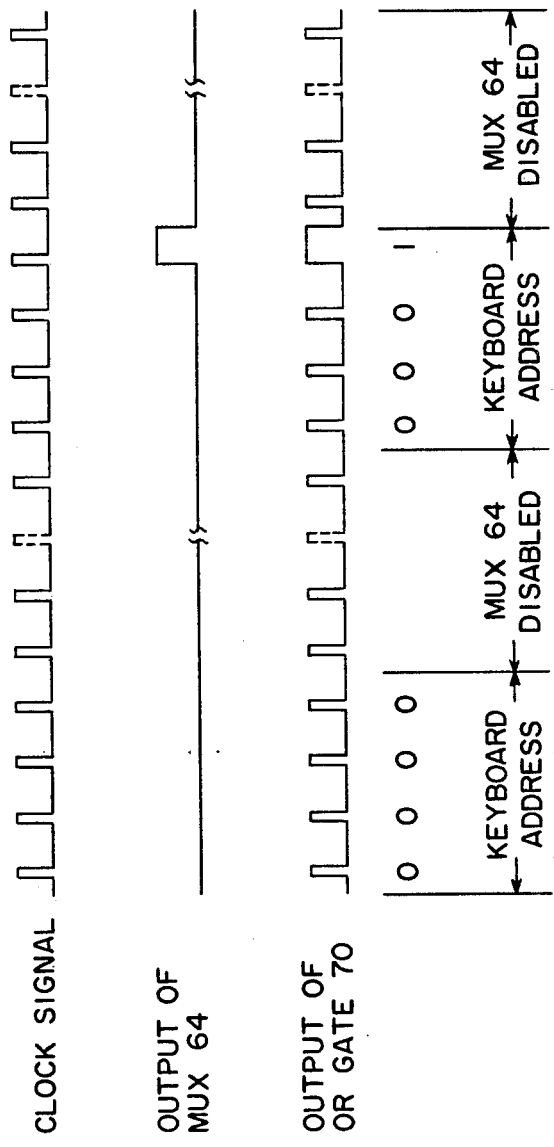

DATA PROCESSING SYSTEM HAVING OPTICALLY LINKED SUBSYSTEMS, INCLUDING AN OPTICAL KEYBOARD

BACKGROUND OF THE INVENTION

The present invention relates to data processing systems, and more particularly, to a data processing system having optically linked subsystems.

Optical keyboards are known in the art. For example, in U.S. Pat. No. 3,856,127, issued to Uri Halfon et al., there is shown a photoelectric keyboard having light sources and associated light-sensitive photocells arranged in an X-Y matrix. Shutters are selectively operable to intercept light passing from each source to its associated photocell. The interception of the light indicates that a key associated with the shutter has been moved or depressed. In U.S. Pat. No. 3,614,402, issued to Leonard James Higgins, there is shown an optical keyboard device having a light source and a light detector, with each key on the keyboard associated with an individually coded target member. The coded target members selectively pass, reflect or absorb, in a particular coded fashion, light passing from the source to the detector so that the depression of each key results in a unique coded light pattern. In U.S. Pat. No. 3,860,754, issued to Roger L. Johnson et al., there is shown a light beam X-Y position encoder for detecting the position of an obstacle, such as a finger, on a display surface. There are included light sources and light detectors arranged along X and Y axes of the display surface, with the light sources sequentially strobed.

It is now widely believed that in future data processing systems, there will be extensive use of optical transmission lines to interconnect subsystems within the data processing systems. Optical transmission lines overcome many problems commonly encountered in the transmission of data in data processing systems, such as interference resulting from EMI (electromagnetic interference), RFI (radiofrequency interference), and ground loop problems. Although optical keyboards have been proposed in the past, there is not known any method whereby an optical keyboard may be linked directly to an optical transmission line connecting the keyboard to some other subsystem in a data processing system. Rather, optical keyboards have used optical signals to merely detect the depression or movement of a key on a keyboard, with the optical signal converted into an electrical signal within the keyboard subsystem prior to being transmitted elsewhere in the system.

SUMMARY OF THE INVENTION

There is provided, in accordance with the present invention, an optical keyboard for use in a data processing system having a plurality of optically linked subsystems. Optical signals generated within the keyboard are coded to indicate the movement or engagement of a key on the keyboard, and are also used to carry the data entered on the keyboard over an optical transmission line linking the keyboard to another subsystem.

In particular, a keyboard in accordance with the present invention has a plurality of light sources, with the light sources sequentially strobed or enabled. The light sources each provide optical signals or light along one of a plurality of predetermined light or optical paths. There is further provided means, such as a shutter associated with each key on the keyboard, for interrupting or coding the optical signals in each of the plurality of light paths in response to engagement of the keys. The optical signals that are coded by the keys are merged into a single optical path and are used to directly transmit the data entered at the keyboard to another subsystem in the data processing system.

In a preferred embodiment described herein, the light sources are light emitting diodes arranged along the X and Y axes of the keyboard, with the predetermined light paths intersecting to form an X-Y matrix and with a key on the keyboard associated with each intersection. All the light paths are directed to an optical transmission line, which merges the light paths into a single optical path for serially carrying the coded optical signals to other subsystems.

By the present invention, an optical keyboard is made particularly suitable for use in an optically linked data processing system. The optical signals encoded by the depression of keys on the keyboard are used directly in the transmission of data over optical transmission lines away from the keyboard subsystem to other subsystems in the data processing system.

It is, therefore, an object of the present invention to provide an improved data processing system of the type having an optical keyboard.

It is another object of the present invention to provide an improved optical keyboard for use in a data processing system having a plurality of optically linked subsystems.

It is yet another object of the present invention to provide an optical keyboard in which the optical signals generated by the depression of keys on the keyboard may be used in the transmission of the data entered on the keyboard to other subsystems in a data processing system.

It is still another object of the present invention to provide an optical keyboard in which data entered on the keyboard may be conveniently coded into optical signals for use in a data processing system.

It is still a further object of the present invention to provide circuitry for use in a data processing system having optically linked subsystems, including an optical keyboard.

These and other objects of the present invention will become more apparent from the following description when taken in conjunction with the attached drawings.

BRIEF DESCRIPTION OF THE DRAWINGS

FIG. 1 is a block diagram illustrating a data processing system having a plurality of optical keyboards in accordance with the present invention.

FIG. 2 is a simplified block diagram illustrating a portion of one of the optical keyboards shown in FIG. 1.

FIG. 3 is a fragmentary view of a key that may be used in the keyboard of FIG. 2, and an associated intersection of two light paths in the keyboard.

FIG. 6 is a diagram illustrating signals generated in the circuitry of FIG. 4.

DESCRIPTION OF THE PREFERRED EMBODIMENT

Figure 4:
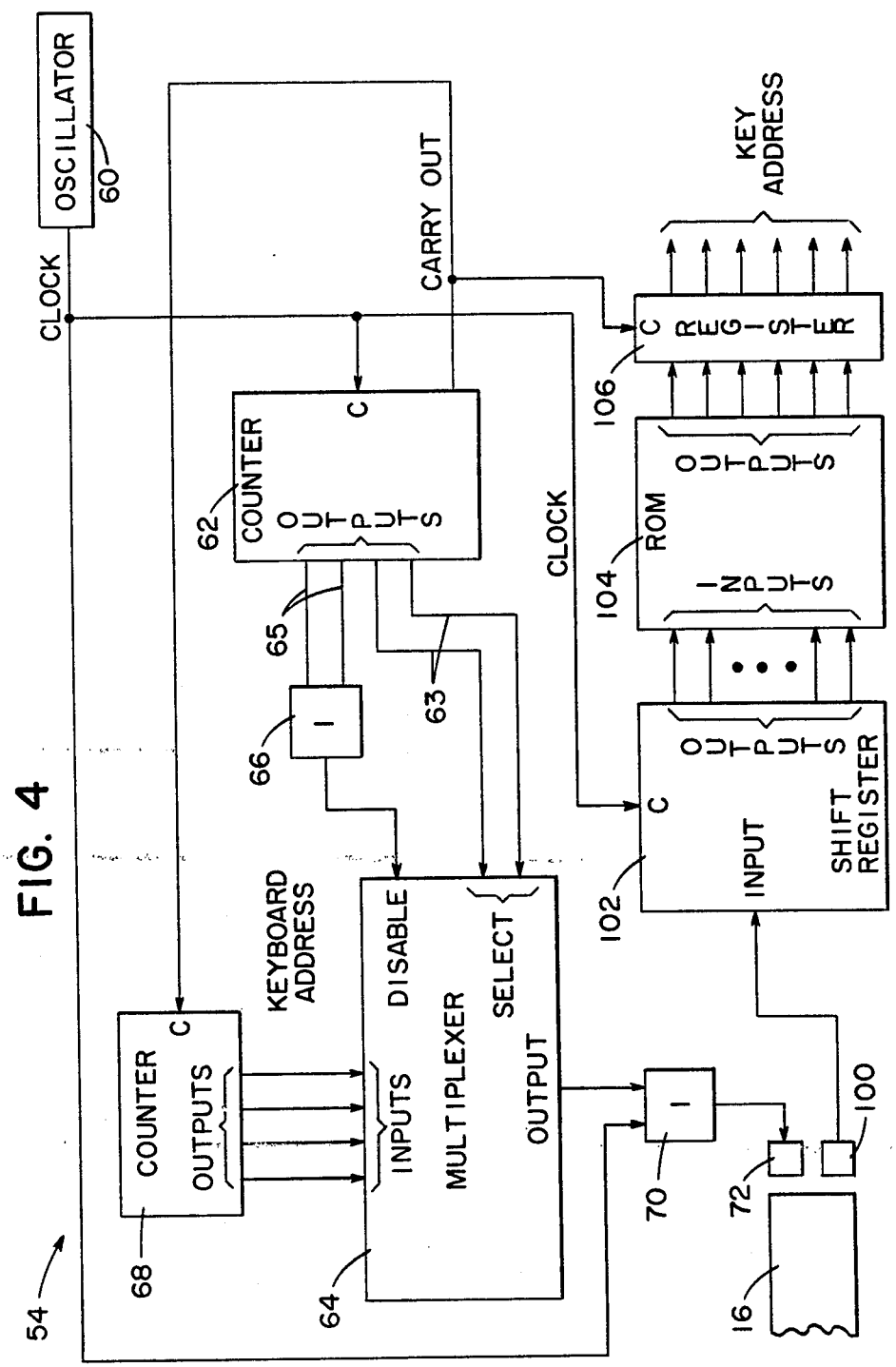
FIG. 4 is a block diagram illustrating circuitry within the keyboard processor of FIG. 1.

Turning now to FIG. 1, there is shown a data processing system 10 in accordance with the present invention. The data processing system 10 is comprised of a plurality of optically linked subsystems. The subsystems include a plurality of keyboards 12 and a keyboard processor 14, with the keyboard processor 14 linked to each keyboard 12 by an optical transmission line 16. The keyboard processor 14 is also optically linked by an optical transmission line 18 to an optical coupler 20. The optical coupler 20 passes optical signals between line 18 and a plurality of optical transmission lines 22, each line 22 leading to further subsystems 24. The subsystems 24 may include processors, input/output devices, storage devices, or the like.

In the operation of the data processing system 10 of FIG. 1, data is entered at each of the keyboards 12, and is transmitted in the form of optical signals over the line 16 to the keyboard processor 14. The keyboard processor 14 manages the flow of data between the keyboards 12 and the other subsystems 24. The optical coupler 20 distributes the optical signals from keyboard processor 14 to each of the subsystems 24, and may be an "optical star coupler". Such an optical coupler is described in Rawson and Metcalfe, *Fibernet: Multimode Optical Fibers for Local Computer Networks*, 26 IEEE Transactions on Communications 983 (1978), and in U.S. patent application Ser. No. 939,726, by Amar Jit Singh, filed Sept. 5, 1978 and assigned to the same assignee as the present application.

The present invention is largely concerned with the transmission of optical signals between each of the keyboards 12 and the keyboard processor 14. As will be more fully described later, each keyboard 12 generates coded optical signals in response to the depression of individual keys on the keyboard, and these coded optical signals are carried over the line 16 to the keyboard processor 14. In contrast to optical keyboards known in the art, each keyboard 12 provides optical signals directly to the line 16, without an intermediate conversion of the optical signals to electrical signals.

In FIG. 2 there is illustrated a portion of each keyboard 12, including a plurality of light sources or light emitting diodes (LED's) 30 arranged along the X and Y axes of the keyboard. In other words, there is both a horizontal row and a vertical column of LED's, with the row of LED's across the top and the column of LED's along the left hand side of the keyboard 12 as viewed in FIG. 2. There is associated with each LED 30 a light receiving fiber or optical transmission line 32, each line 32 carrying the optical signals received from its associated LED to a single optical transmission line 34 which merges the optical signals into a single optical path and which is optially linked to the optical transmission line 16 of FIG. 1.

The optical or light paths formed in the keyboard 12 by the optical signals emitted from each LED 30 are represented by broken lines 36 in FIG. 2. The light paths intersect at points designated 40, forming an X-Y matrix of intersections. Each intersection 40 is associated with one key of the keyboard 12, with one such key 44 shown in FIG. 3.

Referring to FIG. 3, the key 44 includes a kay cap 46 that is touched or depressed in a conventional manner by the operator of the keyboard to enter data. The key cap 46 is connected by a connecting member 48 to a shutter 50. The key cap 46, connecting member 48, and shutter 50 are supported on the keyboard for reciprocative sliding movement, as illustrated by an arrow 52 in FIG. 3.

There is also illustrated in FIG. 3 the intersection 40 of two of the light paths 36 and, in phantom, the location of the shutter 50 when the key 44 is depressed. As should be apparent, the shutter 50 blocks or intercepts the light in both of the light paths 36 in FIG. 3 when the key 44 is depressed.

As will be described later in connection with FIGS. 4, 5, and 6, the LED's 30 are sequentially strobed, for example, beginning with the LED 30 at the upper right hand side of keyboard 12 in FIG. 2, and ending with the LED 30 at the lower left hand side of keyboard 12 in FIG. 2. When none of the keys 44 in keyboard 12 are depressed, the result is an uninterrupted serial pulse train of optical signals arriving at the optical transmission line 34. However, if a key is depressed, two predetermined pulses in the pulse train arriving at line 34 will be missing as a result of one of the key shutters 50 momentarily being in the position illustrated in phantom in FIG. 3. The pulses on line 34 will thus be encoded to indicate which of the keys on keyboard 12 have been depressed.

The optical transmission line 34 is linked to the optical transmission line 16 of FIG. 1 so that the optical signals from each keyboard 12 are delivered to the keyboard processor 14, where they are decoded and processed for use, for example, by one of the other subsystems 24.

It can be seen from the foregoing description that the optical signals generated by the keyboard 12 may be used directly for transmission of the data entered on the keyboard to the keyboard processor 14. As a result, there is no need for one or more photoelectric cells for receiving the optical signals on each of the light paths 36 and converting the optical signals to electrical signals for purposes of transmission. The keyboard 12 is thus particularly suited for a data processing system, such as the system 10 of FIG. 1, where subsystems are optically linked.

Figure 5:
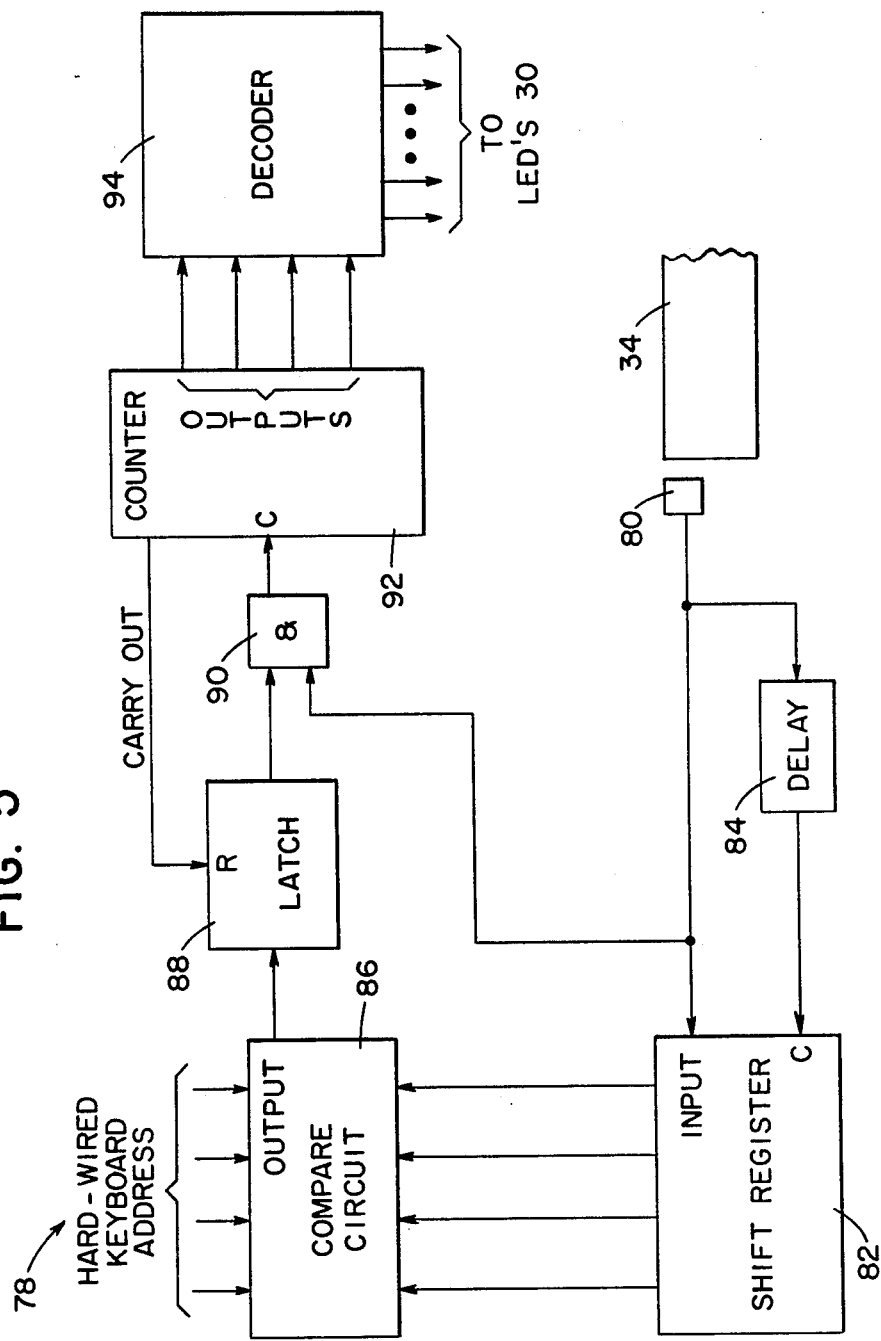
FIG. 5 is a block diagram illustrating circuitry within each of the keyboards of FIG. 1.

FIGS. 4 and 5 illustrate circuitry within the keyboard processor 14 and each keyboard 12 used in transmitting and decoding the optical signals or pulses carried between the keyboard processor 14 and each keyboard 12 over the optical transmission line 16. For purposes of the description to follow, it will be assumed that there will be no more than sixteen addressable keyboards 12 in the data processing system 10, and that each keyboard will have thirty-six keys with twelve LED's 30 providing the light paths 36 and the light path intersections 40 associated with each key. It should be appreciated that in the practice of the present invention there can theoretically be any number of keyboards and keys. Design considerations, such as the width of each optical pulse and the response time of the LED's will, of course, affect the actual number of keyboards and keys used.

Turning first to FIG. 4, there is shown circuitry 54 within the keyboard processor 14. Circuitry 54 includes an oscillator 60 providing CLOCK signals for synchronizing the operations of the keyboard processor 14. The CLOCK signals are received by a binary counter 62, which has its low order output lines 63 presented to the addressing or select lines of a multiplexer 64. The high order input lines 65 of the counter 62 are delivered to an OR gate 66, whose output is in turn delivered to a disable input of the multiplexer 64. When the counter 62 reaches a predetermined full count value, a CARRY OUT signal from the counter 62 is presented to a binary counter 68. The counter 68 is incremented by each CARRY OUT signal from counter 62. The outputs of counter 68 are presented to the data inputs of the multiplexer 64.

A single data output of multiplexer 64 is presented to one input of an OR gate 70. The other input of OR gate 70 receives the CLOCK signal from oscillator 60. The output of OR gate 70 enables a light source or LED 72, which emits light or optical signals to be carried over optical transmission line 16 to each of the keyboards 12.

The two low order output lines 63 of counter 62 provide incrementing select signals to multiplexer 64 in order to pass the signals at its data inputs, one at a time, to the single data output of the multiplexer. Thus, between each of the CARRY OUT signals provided to increment the counter 68, the four bits at the output lines of counter 68 (representing a keyboard address) are passed serially to the output of multiplexer 64. Also between each of the CARRY OUT signals provided to increment counter 68, but after the keyboard address is passed serially to the output of the multiplexer 64, the multiplexer is disabled by the two high order output lines 65 of counter 62, one of which will be at a "1". The resulting serial output of multiplexer 64 will be the incrementing 4-bit keyboard addresses from counter 68, with each keyboard address separated by an interval in which the multiplexer 64 is disabled, the disabled interval lasting 12 cycles of the CLOCK signal.

The OR gate 70 combines each pulse at the output of multiplexer 64 with the CLOCK signal coming from oscillator 60. The result is that LED 72 is enabled to provide optical signals representing each keyboard address at the output of counter 68 and, for the predetermined period of time that the multiplexer 64 is disabled, to provide optical signals representing twelve pulses of the CLOCK signal from oscillator 60.

FIG. 6 illustrates the CLOCK signal generated by oscillator 60, the output of multiplexer 64 for the first two keyboard addresses "0000" and "0001" at the output of counter 68, and the resulting signal at the output of OR gate 70 where each address is separated by twelve pulses. As seen in FIG. 6, the serial pulses representing "1's" at the output of multiplexer 64 are wider than the pulses in the CLOCK signal from oscillator 60, so that the output of OR gate 70 provides a narrow pulse in order to represent a "0" in the keyboard addresses and a wider pulse in order to represent a "1".

Although not shown in FIG. 6, the keyboard addresses from the counter 68 and at the output of OR gate 70 will continue to increment up to "1111", at which point the addresses will return to "0000" and again increment.

Turning now to FIG. 5, there is shown circuitry 78 associated with each of the keyboards 12 for receiving the optical signals generated by the circuitry 54 of FIG. 4. The circuitry 78 includes a photocell or photodetector 80 for receiving the optical signals on optical transmission line 34 coming from optical transmission line 16. The output of the photodetector 80 is connected to the data input of a shift register 82 and to a delay network 84. The shift register 82 receives and stores each keyboard address received by photodetector 80. A compare circuit 86 compares the address stored in shift register 82 with a hard-wired keyboard address associated with each of the keyboards 12. If the comparison indicates that the address in shift register 82 corresponds to the address of the keyboard, a latch 88 at the output of the compare circuit 86 is set.

The delay network 84 is conventional, such as that shown in U.S. Pat. No. 4,159,541, issued to William P. Ward and Donald K. Lauffer, and for reasons which will become apparent, simply delays the clocking of each bit of the keyboard address into the shift register 82. The compare circuit 86 may be an array of EXCLUSIVE OR gates or other conventional circuitry for comparing the bits received from shift register 82 with the bits in the hard-wired address.

Referring still to FIG. 5, the pulses in the keyboard addresses received by photodetector 80 are stored as "1's" in shift register 82 only if they are sufficiently wide to still be present at the input of the shift register after their leading edge passes through delay network 84 and reaches the clock input C. If the pulses are narrow clock pulses, then by the time the pulse is passed through the delay network 84, it will have disappeared at the input of the shift register after its leading edge passes through delay network 84 and reaches the clock input C. If the pulses are narrow clock pulses, then by the time the pulse is passed through the delay network 84, it will have disappeared at the input of the shift register, and a "0" will be stored in the shift register 82.

The output of latch 88 is provided to an AND gate 90 along with the pulses from the output of photodetector 80. The output of AND gate 90 provides an input signal to a counter 92. If the compare circuit 86 indicates a match of the keyboard address and sets latch 88, the twelve pulses of the CLOCK signal from photodetector 80 following the keyboard address pass through AND gate 90 and increment the counter 92. The parallel outputs of counter 92 are provided to a decoder 94 which provides enabling signals at its outputs to cause the 12 LED's 30 in keyboard 12 to be sequentially strobed. Counter 92 generates a CARRY OUT signal when counter 92 has received all twelve pulses, which resets latch 88 so that the next address received by shift register 82 may be compared by compare circuit 86.

As indicated above, the LED's 30 in FIG. 2 are sequentially strobed or enabled, and the resulting pulses, coded to indicate the depression of a key on the keyboard 12, are carried over optical transmission line 16 and are presented to the keyboard processor 14. As seen in FIG. 4, these coded pulses are received by a photodetector 100, and the resulting electrical pulses at the output of photodetector 100 are shifted into a shift register 102. The output of shift register 102 is presented to a ROM 104, which can be programmed or hard-wired in advance to decode the pulses stored in shift register 102. Thus, for any combination of "1's" and "0's" stored in shift register 102, indicating the one or more keys in keyboard 12 that have been depressed, the ROM 104 will provide at its outputs signals indicating the address of the depressed key or keys. Such an address can be stored in a register 106 when the CARRY OUT signal from COUNTER 62 is provided to the clock input C of register 106, indicating that all twelve of the LED's 30 in the keyboard 12 have been enabled. The address stored in register 106 can be used by the keyboard processor 14, for example, to indicate to the other subsystems the data or information being entered at the keyboard 12.

Although not provided in the circuitry illustrated in FIGS. 4 and 5, it should be appreciated that each keyboard address sent to the keyboards along optical transmission line 16 can be preceded, as is conventional, by a preamble. Such a preamble would prevent the keyboards from confusing the keyboard addresses and the clock pulses between the addresses. The preamble could, for example, consist of five pulses representing "1's" and could be received by conventional decoding circuitry that would enable the shift register 82 only after the preamble was received.

Although a presently preferred embodiment of the present invention has been described, it will be understood that within the purview of the invention various changes may be made within the scope of the appended claims.

What is claimed is:

1. In a data processing system having optically-linked subsystems, including a keyboard with a plurality of keys and an optical transmission line for carrying optical signals from said keyboard to at least one other subsystem, the improvement wherein said keyboard comprises:

means for providing optical signals along plurality of optical paths within said keyboard;

means associated with said keys on said keyboard for coding the optical signals along the plurality of optical paths in response to the engagement of any one of said keys; and means for providing the coded optical signals from said keyboard directly to said optical transmission line so that the coded optical signals may be used to provide the data entered at said keyboard to said other subsystem.

2. The data processing system of claim 1, wherein said means for providing optical signals comprises a plurality of optical signal sources arranged to provide the optical signals so that the plurality of optical paths intersect and form an x-y matrix, with one of said keys associated with each intersection, and wherein said optical signal sources are enabled sequentially.

3. The data processing system of claim 1, wherein said means for providing the coded optical signals directly to said optical transmission line includes a plurality of optical fibers, each of said plurality of optical fibers receiving the optical signal on one of the plurality of optical paths, said plurality of optical fibers merging the optical signals on the plurality of optical paths into a single optical path for said optical transmission line.

4. The data processing system of claim 2, wherein said means for coding the optical signals includes a plurality of shutters, each of said plurality of shutters supported for movement into a position for momentarily blocking the optical signals passing along two of the plurality of optical paths through each of the intersections, and wherein each of said shutters is moved into said blocking position in response to the engagement of its associated key.

5. In a data processing system:

a plurality of optical keyboard subsystems, each keyboard subsystem including a plurality of light sources for providing optical signals along an associated plurality of optical paths, means for coding the optical signals when data is entered at the keyboard, and means for merging the optical signals from the plurality of optical paths into a single optical transmission line; and enabling circuitry for enabling the optical sources in said keyboard subsystems, including means for generating a keyboard address for enabling one of said keyboard subsystems and for generating a group of enabling pulses following the keyboard address for sequentially enabling the light sources in the enabled one of said keyboard subsystems.

6. The data processing system of claim 5, wherein said means for generating a keyboard address includes means for incrementing the keyboard address so that each keyboard subsystem is sequentially enabled and during the interval between each keyboard address, each of the light sources in the last enabled keyboard subsystem is enabled.

7. The data processing system of claim 5, wherein said single optical transmission line carries the coded optical signals from the plurality of optical paths in each keyboard subsystem and carries the keyboard addresses and light source enabling pulses from said enabling circuitry to each keyboard subsystem.

8. The data processing system of claim 7, wherein each one of said keyboard subsystems further includes address means for receiving the keyboard addresses and comparing each keyboard address to a keyboard address assigned to that one of said keyboard subsystems, and generating an enabling signal if the received and assigned keyboard addresses are the same.

* * * * *